(12) United States Patent
Komatsu et al.

(10) Patent No.: US 7,692,435 B2
(45) Date of Patent: Apr. 6, 2010

(54) PROBE CARD AND PROBE DEVICE FOR INSPECTION OF A SEMICONDUCTOR DEVICE

(75) Inventors: Shigekazu Komatsu, Nirasaki (JP); Takashi Amemiya, Nirasaki (JP); Jun Mochizuki, Nirasaki (JP)

(73) Assignee: Tokyo Electron Limited (JP)

( * ) Notice: Subject to any disclaimer, the term of this patent is extended or adjusted under 35 U.S.C. 154(b) by 166 days.

(21) Appl. No.: 11/701,379

(22) Filed: Feb. 2, 2007

(65) Prior Publication Data

US 2007/0182431 A1    Aug. 9, 2007

(51) Int. Cl.
*G01R 31/02* (2006.01)

(52) U.S. Cl. .................................... 324/754; 324/761

(58) Field of Classification Search ................. None
See application file for complete search history.

(56) References Cited

U.S. PATENT DOCUMENTS

| 5,489,853 | A | * | 2/1996 | Nakajima | 324/754 |
| 5,973,504 | A | * | 10/1999 | Chong | 324/754 |
| 6,246,250 | B1 | * | 6/2001 | Doherty et al. | 324/765 |
| 6,377,062 | B1 | * | 4/2002 | Ramos et al. | 324/758 |
| 6,480,012 | B1 | * | 11/2002 | Komori | 324/754 |
| 6,640,415 | B2 | * | 11/2003 | Eslamy et al. | 29/593 |
| 6,812,720 | B1 | * | 11/2004 | Cheng et al. | 324/755 |
| 6,838,893 | B2 | * | 1/2005 | Khandros et al. | 324/754 |
| 6,853,205 | B1 | * | 2/2005 | Cheng et al. | 324/754 |
| 2004/0207420 | A1 | * | 10/2004 | Cheng et al. | 324/755 |

FOREIGN PATENT DOCUMENTS

JP          05-264589          10/1993

* cited by examiner

*Primary Examiner*—Vinh P Nguyen
(74) *Attorney, Agent, or Firm*—Finnegan, Henderson, Farabow, Garrett & Dunner, L.L.P.

(57) ABSTRACT

The probe card is configured such that the outline of the probe card is formed almost round shape and a plurality of connectors for being electrically connected with a tester are provided on the upper surface thereof along the outline. A substrate with many probes arranged thereon is provided on the bottom surface of the probe card. The substrate and the connectors are connected with one another via a flexible print wiring board.

8 Claims, 2 Drawing Sheets

PROBE CARD AND PROBE DEVICE FOR INSPECTION OF A SEMICONDUCTOR DEVICE

CROSS-REFERENCE TO RELATED APPLICATIONS

This application is based upon and claims the benefit of priority from the prior Japanese Patent Application No. 2006-026614 filed on Feb. 3, 2006; the entire contents which are incorporated herein by reference.

BACKGROUND

1. Field of the Invention

The present invention relates to a probe card and a probe device usable for the inspection of a semiconductor device or the like which is formed on a semiconductor wafer.

2. Description of the Related Art

In a conventional semiconductor device manufacturing process, a semiconductor device formed on a semiconductor wafer used to be inspected by a probe device on which a probe cared with a probe is mounted and a tester which supplies an electric signal for inspection (e.g., refer to Japanese Patent Laid-open Application No. 5-264589).

In the simultaneous inspection of a plurality of semiconductor devices, a multi-measurement probe card is employed. The multi-measurement probe card is configured so as to include a plurality of probes, a space transformer (ST substrate) for pitch transformation, an interface board (I/F substrate) on which a connector is mounted so as to be electrically and mechanically connected with a tester via a test board of the tester, and an interposer which is provided at the bottom portion of the interface board, thereby allowing the height control and the parallel drawing of the probe.

SUMMARY

Conventionally, as described above, a multilayered probe card, configured to include the interface board, the interposer and the space transformer, is employed. However, since the multilayered probe card becomes complicated in structure, the manufacturing process becomes complicated and the manufacturing cost becomes expensive.

It is an object of the present invention, in view of the above-described problems, to provide a probe card and a probe device which can be manufactured easily so that the manufacturing costs of the probe card and the probe device can be reduced in comparison with the conventional ones.

An aspect of the present invention relates to a probe card, includes: a connector to be electrically connected with a tester which supplies a signal to a semiconductor device for inspection; a substrate having a plurality of probes to be contacted with electrode pads of the semiconductor device and an electric wiring pattern formed commensurate with the probes; and a flexible connector to electrically connect the connector and the substrate.

According to another aspect of the present invention, in the probe card, the height of the probes is adjustable through a length control of the flexible connector. According to still another aspect of the present invention, in the probe card, the flexible connector is a cable. According to a further aspect of the present invention, in the probe card, the flexible connector is a flexible print circuit board.

According to an aspect of the present invention, the probe card further includes a ring-shaped frame configured such that the connector is provided at the frame.

An aspect of the present invention relates to a probe device includes a probe card, which includes a connector to be electrically connected with a tester which supplies a signal to a semiconductor device for inspection; a substrate having a plurality of probes to be contacted with electrode pads of the semiconductor device and an electric wiring pattern formed commensurate with the probes; and a flexible connector to electrically connect the connector and the substrate.

According to another aspect of the present invention, in the probe device, the height of the probes is adjustable through a length control of the flexible connector. According to still another aspect of the present invention, in the probe device, the flexible connector is a cable. According to a further aspect of the present invention, in the probe device, the flexible connector is a flexible print circuit board.

According to an aspect of the present invention, in the probe device, the probe card further includes a ring-shaped frame configured such that the connector is provided at the frame.

DETAILED DESCRIPTION

Hereinafter, embodiments of the present invention will be described with reference to the drawings.

Figure 1:
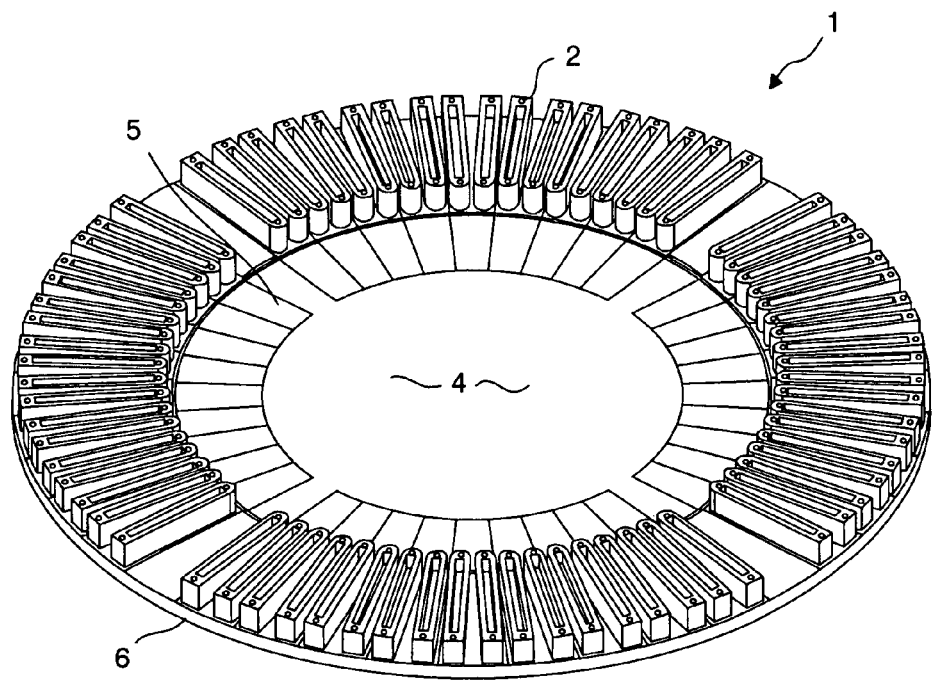
FIG. 1 is a perspective view schematically showing the structure of a probe card according to an embodiment of the present invention, as viewed from the upper side.
Figure 2:
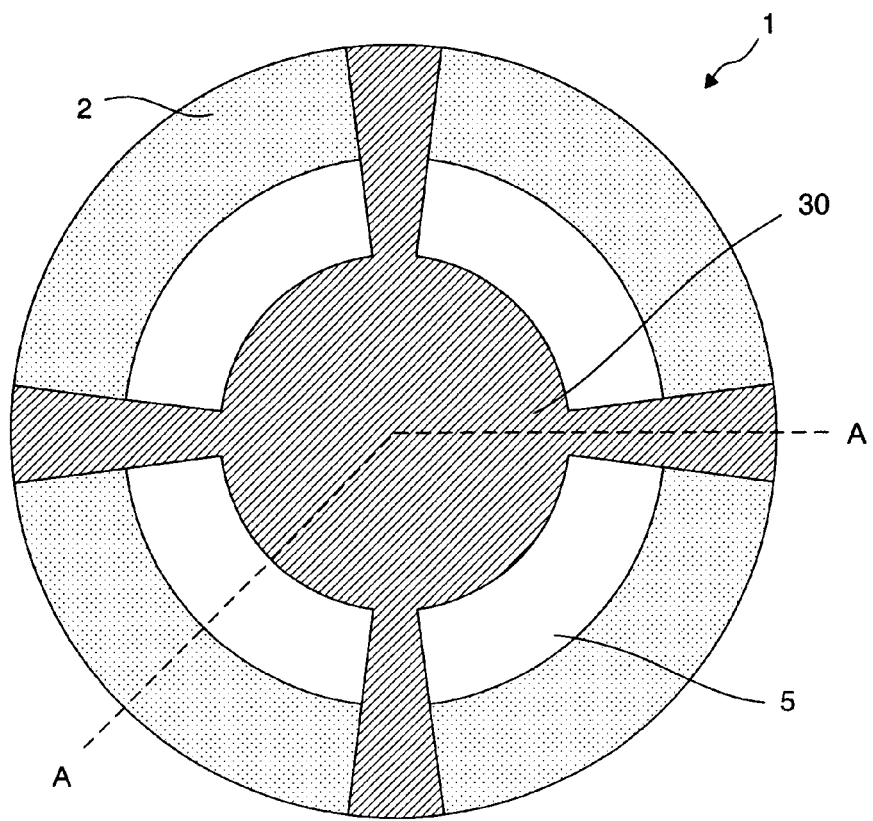
FIG. 2 is a plan view schematically showing the top side structure of the probe card shown in FIG. 1.
Figure 3:
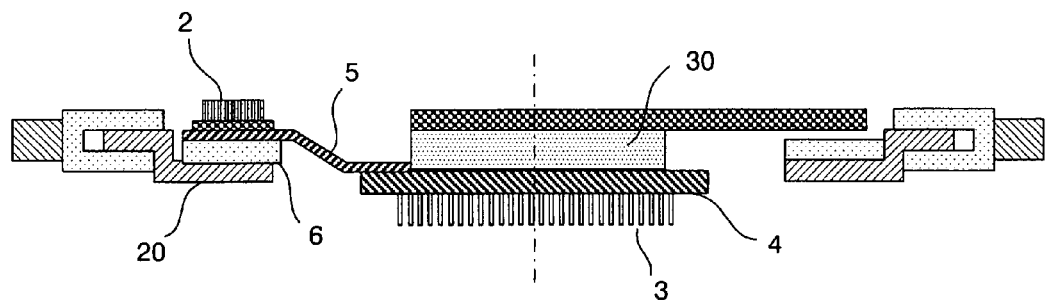
FIG. 3 is a cross-sectional view schematically showing the probe card shown in FIG. 2, taken on line A-A.
Figure 4:
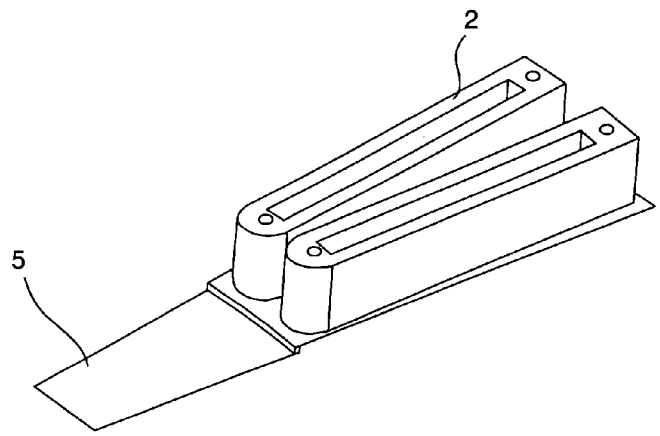
FIG. 4 is a perspective view schematically showing a portion of the probe card shown in FIG. 1.

FIGS. 1 to 4 show the structure of a probe card 1 according to this embodiment. FIG. 1 is a perspective view schematically showing the structure of the probe card 1, as viewed from the upper side. FIG. 2 is a plan view schematically showing the top side structure of the probe card 1 shown in FIG. 1. FIG. 3 is a cross-sectional view schematically showing the probe card 1 shown in FIG. 2, taken on line A-A. FIG. 4 is a perspective view schematically showing a portion of the probe card 1 shown in FIG. 1.

As shown in these drawings, the outline of the probe card 1 is formed almost round shape such that a plurality of connectors 2 for being electrically connected with a tester (concretely, a test head 31 as described below with reference to FIG. 5) are provided on the upper surface of the probe card 1 along the outline. Then, the connectors 2 are grouped so that a plurality of spaces are formed between the adjacent grouped connectors, respectively. In FIGS. 1 and 2, the connectors 2 are grouped into four so that four spaces are formed between the adjacent grouped connectors, respectively. The spaces are formed so as to be orthogonal to one another. As shown in FIG. 2, a supporter for the stiffener 30 of the I/F substrate is provided in the spaces.

As shown in FIG. 3, a substrate (space transformer) 4 with many probes 3 arranged thereon is provided on the bottom surface of the probe card 1. The probes 3 are arranged commensurate with the electrode pads of a semiconductor device (not shown) to be inspected. A wiring (not shown) is formed on the substrate 4 commensurate with the probes 3.

The substrate 4 and the connectors 2 are electrically connected with one another via flexible print circuit boards (FPC) 5 as flexible connectors. As shown in FIG. 4, each flexible print circuit board 5 is formed in strip of paper. The flexible print circuit boards 5 are arranged along the outline of the probe card 1 so that all of the connectors 2 can be electrically connected with the substrate 4.

As shown in FIG. 3, a ring-shaped frame 6 is provided on the bottom surface of the probe card 1 so that the connectors 2 are arranged on the frame 6. The edges of the flexible print circuit boards 5 are sandwiched between the frame 6 and the connectors 2, respectively, so that the flexible print circuit boards 5 are electrically connected with the connectors 2, respectively.

Each flexible print circuit board 5 may be configured so as to contain one conductive pattern or multilayered conductive pattern constituting a multilayered flexible print circuit board 5. Instead of the flexible print circuit boards 5, flexible cables may be employed.

As shown in FIG. 3, the probe card 1 is fixed at a card holder 20 of the probe device. Then, the substrate 4 is fixed at the stiffener 30 of the I/F substrate, and thus, maintained horizontally. The length of each flexible print circuit board 5 is controlled in advance such that the substrate 4 and the probes 3 can be maintained at respective predetermined surface levels. In this case, it is desired that the length of each flexible print circuit board 5 is set within a given allowable range so that the parallelization of the substrate 4 and the probes 3 for the wafer can be controlled finely.

Figure 5:
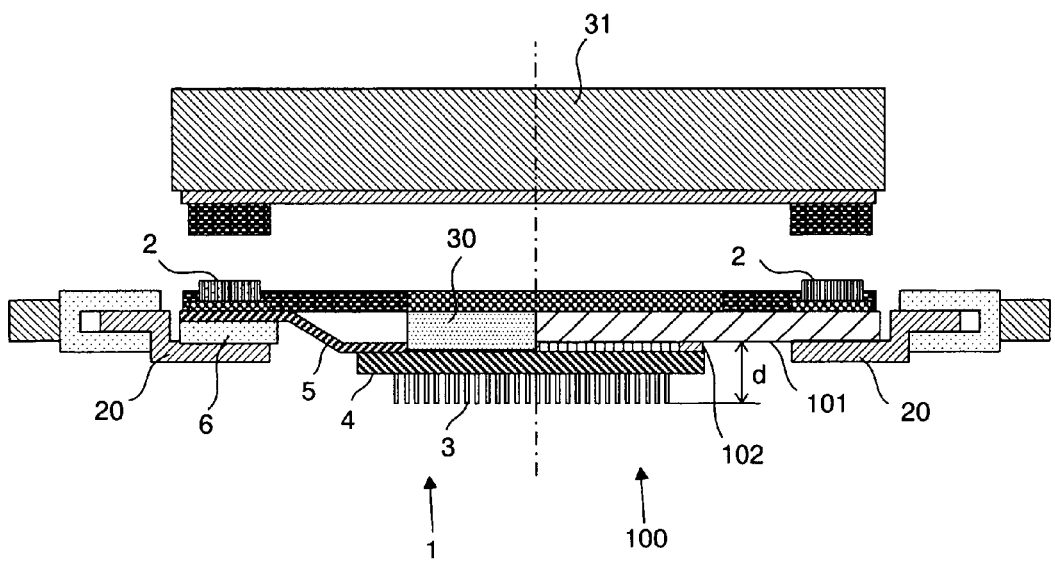
FIG. 5 is a view schematically showing the state where the probe card shown in FIG. 1 is depicted in comparison with a conventional probe card.

FIG. 5 shows the structure of the probe card 1 in this embodiment at the left side of the center line depicted by the dashed line and the structure of a conventional probe card 100 at the right side of the center line. As shown in FIG. 5, with the conventional probe card 100, the connectors 2 to be electrically connected with the test head 31 of the tester are provided on an interface board 101 and connected with the substrate 4 via an interposer 102 for adjusting the parallelism and the surface level of the interface board 101. Herein, the interposer 102 contains many minute electrical paths therethrough so as to electrically connect the interface board 101 and the substrate 4.

With the probe card 1 in this embodiment, in contrast, since the connectors 2 and the substrate 4 are connected with one another via the flexible print circuit boards 5 as the flexible connectors, the structure of the probe card 1 can be simplified. As a result, the manufacturing process of the probe card 1 can be simplified so that the manufacturing cost of the probe card 1 can be reduced. Particularly, with the conventional probe card 100, since it is difficult to form the interface board 101 with a fine wiring in large scale, the prolonged manufacturing time and expensive manufacturing cost are required for the interface board 101. Moreover, since the interposer 102 includes many minute electrical though-paths, the prolonged manufacturing time and expensive manufacturing cost are also required for the interposer 102. In contrast, since the probe card 1 does not require the interface board 101 and the interposer 102, the manufacturing time can be shortened and the manufacturing cost can be reduced.

With the probe card 100, the height of the probes 3 is controlled by changing the thickness of the interposer 102. Therefore, the probes 3 can be projected appropriately in accordance with the thickness of the card holder 20. The distance between the forefronts of the probes 3 and the bottom surface of the interface board 101 can be set, e.g., within 8.3 to 12 mm. With the probe card 1, in contrast, the height of the probes 3 can be controlled by changing the length of the flexible print circuit boards 5.

With the probe card 100, the interposer 102 is flexible so as to control the parallelism of the substrate 4 and the probes 3 for the wafer and compensate the distortion of the interface board 101. With the probe card 1, in contrast, since the flexible print circuit boards 5 are flexible, the flexible print circuit boards 5 control the parallelism of the substrate 4 and the probes 3 for the wafer. Moreover, since the probe card 1 does not include the interface board 101, it is not required for the probe card 1 to compensate the distortion of the interface board 101.

Although the present invention was described in detail with reference to the above examples, this invention is not limited to the above disclosure and every kind of variation and modification may be made without departing from the scope of the present invention.

What is claimed is:

1. A probe card, comprising:
   a connector electrically connected with a tester which supplies a signal to a semiconductor device for inspection;
   a substrate which is a space transformer, the substrate having a first surface, a second surface, and a plurality of probes in contact with electrode pads of said semiconductor device and an electric wiring pattern formed commensurate with said probes; and
   a flexible connector for electrically connecting said connector and the first surface of said substrate, the first surface of said substrate being opposite to the second surface of said substrate facing said semiconductor device,
   wherein a surface level of said probes is adjustable by controlling a length of said flexible connector.

2. The probe card as set forth in claim 1, wherein said flexible connector is a cable.

3. The probe card as set forth in claim 1, wherein said flexible connector is a flexible print circuit board.

4. The probe card as set forth in claim 1, further comprising:
   a ring-shaped frame, said connector being arranged on said frame.

5. A probe device comprising a probe card, said probe card, comprising:
   a connector electrically connected with a tester which supplies a signal to a semiconductor device for inspection;
   a substrate which is a space transformer, the substrate having a first surface, a second surface, and a plurality of probes in contact with electrode pads of said semiconductor device and an electric wiring pattern formed commensurate with said probes; and
   a flexible connector for electrically connecting said connector and the first surface of said substrate, the first surface of said substrate being opposite to the second surface of said substrate facing said semiconductor device,
   wherein a surface level of said probes is adjustable by controlling a length of said flexible connector.

6. The probe device as set forth in claim 5, wherein said flexible connector is a cable.

7. The probe device as set forth in claim 5, wherein said flexible connector is a flexible print circuit board.

8. The probe device as set forth in claim 5, wherein said probe card further comprises:
   a ring-shaped frame, said connector being arranged on said frame.

* * * * *

UNITED STATES PATENT AND TRADEMARK OFFICE
CERTIFICATE OF CORRECTION

| | | |
|---|---|---|
| PATENT NO. | : 7,692,435 B2 | Page 1 of 1 |
| APPLICATION NO. | : 11/701379 | |
| DATED | : April 6, 2010 | |
| INVENTOR(S) | : Shigekazu Komatsu et al. | |

It is certified that error appears in the above-identified patent and that said Letters Patent is hereby corrected as shown below:

Title page, col. 1, below item (65) and above item (51), insert the following:

--(30)   Foreign Application Priority Data

Feb. 3, 2006    (JP) .............................P2006-026614--

Signed and Sealed this

Eighth Day of June, 2010

David J. Kappos
*Director of the United States Patent and Trademark Office*